United States Patent
Yokoyama et al.

[11] Patent Number: 5,443,786
[45] Date of Patent: Aug. 22, 1995

[54] COMPOSITION FOR THE FORMATION OF CERAMIC VIAS

[75] Inventors: Hiromitsu Yokoyama, Sagamihara; Koji Omote, Atsugi; Hitoshi Suzuki, Zama; Mineharu Tsukada, Yamato; Nobuo Kamehara, Isehara; Koichi Niwa, Tokyo, all of Japan

[73] Assignee: Fujitsu Limited, Kawasaki, Japan

[21] Appl. No.: 700,163

[22] PCT Filed: Sep. 19, 1990

[86] PCT No.: PCT/JP90/01202
§ 371 Date: Dec. 17, 1991
§ 102(e) Date: Dec. 17, 1991

[87] PCT Pub. No.: WO91/04650
PCT Pub. Date: Apr. 4, 1991

[30] Foreign Application Priority Data
Sep. 19, 1989 [JP] Japan .................. 1-240684

[51] Int. Cl.6 .................. B22F 7/00; H01B 1/02; H01B 1/04
[52] U.S. Cl. .................. 419/9; 419/13; 419/19; 419/21; 252/512; 252/513; 252/514; 252/515
[58] Field of Search .................. 156/8, 9; 361/304, 321; 419/9, 10, 19, 13, 21; 252/512, 513, 514, 515

[56] References Cited

U.S. PATENT DOCUMENTS

| 4,346,516 | 8/1982 | Yokouchi et al. | 29/845 |
| 4,576,735 | 3/1986 | Kuroki et al. | 252/512 |
| 4,599,277 | 7/1986 | Brownlow et al. | 426/522 |
| 4,885,038 | 12/1986 | Anderson, Jr. et al. | 156/89 |
| 4,954,926 | 7/1990 | Pepin | 361/304 |

FOREIGN PATENT DOCUMENTS

| 272129 | 6/1988 | | |
| 177772 | 4/1986 | European Pat. Off. | |
| 6084711 | 5/1985 | Japan | |
| 60-84711 | 8/1985 | Japan | |
| 64-38905 | 2/1989 | Japan | H01B 1/16 |
| 64-54613 | 3/1989 | Japan | H01B 13/00 |
| 64-81106 | 3/1989 | Japan | H01B 1/16 |

*Primary Examiner*—Donald P. Walsh
*Assistant Examiner*—Anthony R. Chi
*Attorney, Agent, or Firm*—Staas & Halsey

[57] ABSTRACT

A composition for the formation of vias on a ceramic substrate, the composition including (a) at least one powder containing copper, gold, silver, tungsten, molybdenum, nickel, palladium, platinum, aluminium, or an alloy thereof; and (b) 5 to 40 wt %, based on the weight of the powder in the composition, of one or more of an organosilicic compound, an organoaluminium compound, and organozirconium compound, and an organomagnesium compound. A further embodiment of a composition for the formation of vias includes (a) and (b) above and, in addition, (c) a binder material including a cellulose derivative or a heat decomposable polymethamethyl acrylate binder, and (d) a high boiling point organic solvent. The invention also includes a method for use in the formation of vias on a substrate having perforating holes therein. Such a substrate could be a glass ceramic composite substrate, an alumina substrate, a magnesia substrate, a zirconia substrate, or green sheets thereof. The holes are filled and the substrate is calcinated with the composition.

7 Claims, 3 Drawing Sheets

COMPOSITION FOR THE FORMATION OF CERAMIC VIAS

TECHNICAL FIELD

The present invention relates to a composition for the formation of ceramic vias and more particularly, to a paste composition to be used for the formation of vias of a ceramic substrate for mounting a semiconductor device, and a method of forming the vias by using the composition.

BACKGROUND ART

The increasing densification of the elements of a semiconductor device in recent years has led to a use for an increased densification of the wiring in a substrate on which these elements are mounted. Accordingly, it is now necessary to greatly reduce the size of the vias used for interphasic electric connections.

As the conventional methods of forming vias, there are known a method in which holes are bored in a green sheet with a drill, punch or laser and a paste filled into the thus-bored holes by screen printing; a method in which holes are bored in a green sheet covered with a carrier film, and a paste or powder filled into the thus-bored holes through the carrier film; and a method of forming vias by filling metallic balls directly into a green sheet.

The above methods of filling a paste or powder, however, have the following defects. When a paste is filled into the holes of a substrate or green sheet, organic components contained in the paste are decomposed and volatilized when the substrate or green sheet is calcined, and thus an insufficiently filled state of the vias occurs due to the volume loss of the paste or powder. Even when powder having a small volume loss is filled into holes for making vias, problems arise in that it is difficult to fill the powder into minute holes for vias and that the operating efficiency is lowered. These problems result in the formation of gaps at the interface between a conductor and substrate around the circumference of a via. Furthermore, a weak adhesion between a conductor and a substrate is a problem to be solved, and ideally these problems can be solved at the same time.

DISCLOSURE OF THE INVENTION

The present invention relates to a composition for the formation of ceramic vias, and its purpose is to settle the problems of the conventional via formation. These problems include gaps produced on the interface between a conductor and a substrate, as well as the weakness of the adhesion strength between the conductor and the substrate, both being a result of an insufficient filling of a filler into the vias. Such an insufficiently filled state of vias is due to a volume reduction of the filler after sintering, and a crux of the present invention resides in a composition for the formation of vias on a ceramic substrate.

The object of the present invention is to provide a composition for the formation of vias and a method of forming the vias by using the composition, whereby the problems such as gaps at the interface between a conductor and substrate and the weak adhesion between the conductor and substrate are solved.

At the present composition, there may be adopted, according to the kind of substrate and the organometallic compound used, a highly viscous or powdered solid composition consisting of a first component, i.e., a metallic powder, and a second component, i.e., 5 to 40 wt %, based on the weight of the metallic powder, of an organometallic compound.

Also according to the kind of the substrate and the organometallic compound used, it is possible to adopt a paste-like composition prepared by adding a third component, i.e., a heat decomposable organic binder, and a fourth component, i.e., a high boiling point organic solvent, to the above components.

The present method of forming ceramic vias is characterized in that holes are bored in a glass ceramic substrate, an alumina substrate, a magnesia substrate or zirconia substrate, or green sheets thereof, and the above-described composition is filled into the thus-formed holes, and thereafter, the substrate or green sheet is calcined.

The present composition for the formation of ceramic vias comprises the following components (a) and (b):
(a) at least one metallic powder or alloy powder selected from the metallic powders of copper, gold, silver, tungsten, molybdenum, nickel, palladium, platinum, or aluminum, or alloy powders thereof; and
(b) 5 to 40 wt %, based on the metallic powder or the alloy powder, of an organometallic compound selected from the group consisting of organosilicic compounds, organoaluminum compounds, organozirconium compounds, and organomagnesium compounds.

The thus-constituted composition is a powdered or highly viscous solid composition.

The present composition for the formation of vias on a ceramic substrate comprises the following components (c) and (d), in addition to the above components (a) and (b):
(c) a cellulose derivative or heat decomposable polymethamethyl acrylate binder; and
(d) a high boiling point organic solvent.

The thus-constituted composition is a paste-like composition.

The present method of forming vias in a ceramic substrate is characterized in that holes are bored in a ceramic substrate such as a glass ceramic composite substrate, an alumina substrate, magnesia substrate or zirconia substrate, or green sheets thereof, and any of the above compositions is filled into the thus-formed holes, and thereafter, the substrate or green sheet is calcined.

When filling the present composition in the form of a paste, preferably the amount of organic components is reduced and organic components that are converted into inorganic substances by a calcination thereof are employed. In addition, when powder is filled, preferably the fluidity of the powder is improved. Furthermore, to improve the adhesive strength of the composition, an additive must be uniformly dispersed in the composition. Accordingly, the additive should be a liquid. To satisfy the above requirements, an organometallic compound and metallic powder are mixed, and an amount of an organic binder and an organic solvent are added to the obtained mixture. The organometallic compound exhibits a function of an organic binder before it is calcined, and after the calcination, is converted into a metallic oxide or metallic nitride.

As the metals forming the present composition, there may be mentioned metals such as copper, gold, silver, tungsten, molybdenum, nickel, palladium, platinum or aluminium, or alloys of these metals, and there are employed preferably in a powdered form, alone or as a mixture of two or more thereof. As the organometallic compound forming the present composition, there may be mentioned organosilicic compounds, organoaluminium compounds, organozirconium compounds or organomagnesium compounds.

As the organosilicic compound, preferably polysilazane, trichlorosilane [$HSiCl_3$], dichlorodimethylsilane [$(CH_3)_2SiCl_2$], chlorotrimethylsilane [$(CH_3)_3SiCl$], cyanotrimethylsilane [$(CH_3)_3SiCN$], chloromethyltrimetylsilane [$(CH_3)_3(CH_2Cl)Si$], hexamethyldisiloxane [$(CH_3)_3Si]_2O$], tetramethoxysilane [$(CH_3O)_4Si$], dihydroxydiphenylsilane [$(C_6H_5)_2Si(OH)_2$], methoxytrimethylsilane ($(CH_3)_3SiOCH_3$], trimethylsilylazide [$(CH_3)_3SiN_3$] are used.

The amount of these compounds to be added is within the range of from 5 to 40 wt % based on the weight of the metallic powder. The above range is defined because when the above amount is below 5 wt %, the fluidity of a paste containing such a compound is lowered and the fillability thereof is worsened and when it exceeds 40 wt %, the paste flows out of the vias and gaps are formed at the circumferences of the vias due to an excessively large volume loss of the paste.

As the organoaluminium compound, preferably aluminiumtri-sec-butoxide, aluminiumtri-ethoxide [$(C_2H_5O)_3Al$], aluminiumtri-isopropoxide [(iso-$C_3H_7O)Al$], triethylaluminium [$(C_2H_5)_3Al$], diethylaluminium ethoxide [$(C_2H_5)_2AlOC_2H_5$] are used.

The amount of these compounds to be added is within the range of from 5 to 40 wt % based on the weight of the metallic powder. The above range is defined because, when the above amount is below 5 wt %, the coefficient of contraction of the filler and that of the substrate do not match and the adhesion strength between the filler and substrate is weakened, and when it exceeds 40 wt %, gaps are formed at the circumference of the vias due to a large volume loss of the filler.

The above range may be narrowed according to the kind of substrate. In more detail, the preferable range is from 5 to 35 wt % for an alumina substrate, from 5 to 40 wt % for an AlN substrate, from 5 to 25 wt % for a magnesia substrate, from 5 to 40 wt % for a glass ceramic substrate, and from 5 to 35 wt % for a zirconia substrate.

The preferred organozirconium compounds are dicyclopentadienylzirconium dichloride [$C_5H_5)_2ZrCl_2$] (white crystal), etc., and the amount of these compounds to be added is also within the range of from 5 to 40 wt % based on the weight of the metallic powder. The above range is defined because, when the above amount is below 5 wt %, the adhesion strength between the substrate and the conductor containing such a compound is weakened, and when it exceeds 40 wt %, gaps are formed at the circumferences of the via holes due to the large volume loss of the filler.

The preferably employed organicmagnesium compounds are n-butylmagnesium chloride, methylmagnesium bromide [$CH_3MgBr$], methylmagnesium iodide [$CH_3MgI$], vinylmagnesium bromide [$CH_2=CHMgBr$], sec-butylmagnesium chloride [sec-$C_4H_9MgCl$], etc.

The amount of these compounds to be added is also within the range of from 5 to 40 wt % based on the weight of metallic powder. The above range is defined because, when the above amount is below 5 wt %, the adhesion strength as described above is weakened, and when it exceeds 40 wt %, gaps are formed at the circumferences of the vias due to a large volume loss of the filler.

As the heat decomposable organic binder, the third component of the present composition, a cellulose derivative or polymethamethyl acrylate (PMMA) is employed. As the cellulose derivative, preferably ethyl cellulose, methyl cellulose, butyl cellulose, nitrocellulose etc., are used.

The amount of the organic binder to be added is within the range of from 0.5 to 5 wt % based on the weight of metallic powder. The above range is defined because, when the above amount is below 0.5 wt %, the fluidity of the paste containing such a binder is low and the fillability, thereof is lowered, and when it exceeds 5 wt %, the fluidity of the paste is so high that the paste flows out of the vias and gaps are formed at the circumferences of the vias due to the large volume loss of the paste.

The fourth component of the present composition, i.e., the high boiling point organic solvent, is an organic solvent with a boiling point of from 180° to 400° C. Examples thereof are turpentine oil, dibutyl phthalate, ethylene glycol, polyethylene glycol, butyl carbitol acetate, and butyl carbitol. These organic solvents are adopted because, when a solvent with a boiling point below 180° C. is employed, the solvent is volatilized during the filling of a filler containing the solvent, and the fluidity of the filler is lowered, and when a solvent with a boiling point exceeding 400° C. is employed, it is difficult to volatilize same at the time of the calcination of a substrate filled with such a filler, and thus the sinterability of the conductor becomes poor.

The amount of the solvent to be used in the composition is preferably within the range of from 1 to 20 wt %.

Figure 1A:
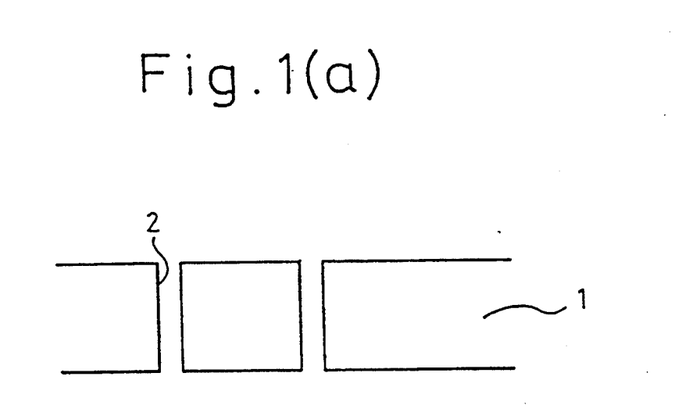
FIGS. 1(a) and 1(b) are diagrams chart illustrating an embodiment of the present method.
Figure 1B:
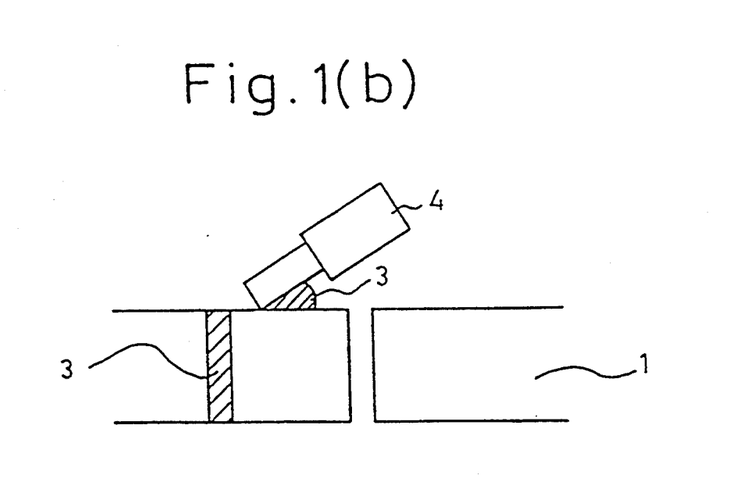

In the present method of forming vias, as illustrated in FIGS. 1(a) and 1(b), a substrate 1 is perforated to thereby provide a hole 2, and subsequently, the present composition 3 is filled, using a squeezer 4, directly into the hole 2, and thereafter, the substrate thus-filled with the present composition is calcined at a predetermined temperature.

Figure 2A:
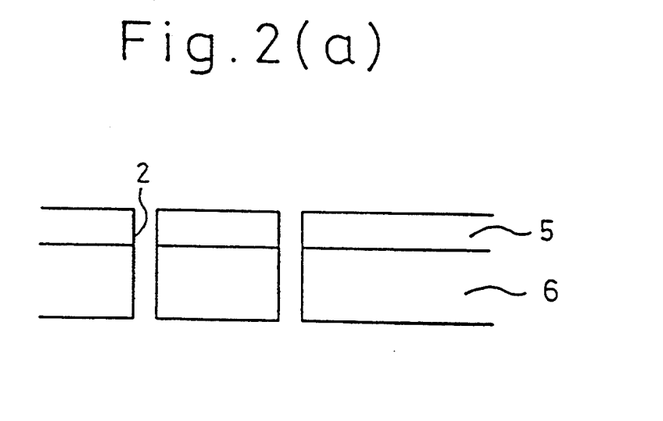
FIGS. 2(a), 2(b) and 2(c) are diagrams illustrating another embodiment of the present method.
Figure 2B:
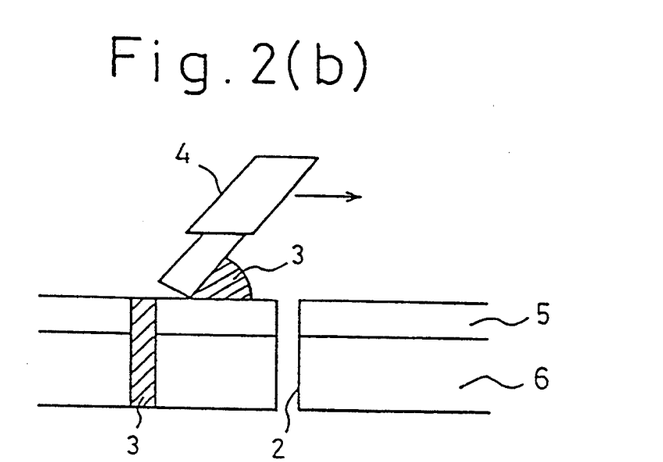
Figure 2C:
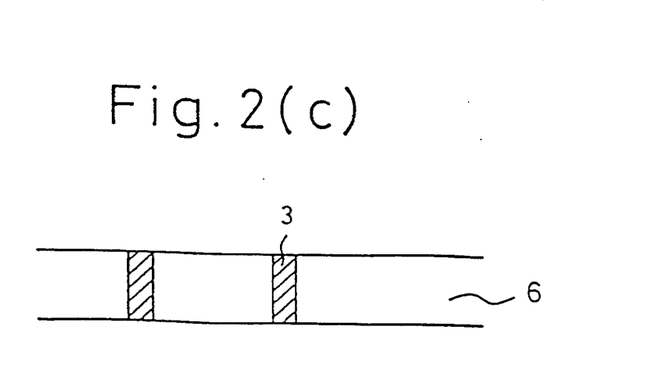

Also in the present method, as illustrated in FIGS. 2(a), 2(b) and 2(c), the present composition 3 is filled into the hole 2 through a carrier film 5 of a green sheet covered by said film. Subsequently, the carrier film is removed, and two or more of thus-filled green sheets are laminated and the thus-obtained laminate calcined at a predetermined temperature.

As the substrate used in the present method, preferably a ceramic substrate such as a glass ceramic composite substrate, an alumina substrate, a magnesia substrate or zirconia substrate are employed.

Alternatively, a green sheet converted into one of the above substrates by a calcination thereof may be employed.

The calcination temperature when a substrate is obtained from a green sheet is within the range of from 800° to 1000° C., e.g., for a glass ceramic substrate, and when AlN, $ZrO_2$, and MgO green sheets are calcined, the calcination temperatures are, respectively, within the range of from 1600° to 1900° C. Where Cu, Ag or Au is contained in the composition, the calcination temperature is within the range of from 800° to 1000° C., and when W or Mo is contained in the composition, the calcination temperature is within the range of from 1500° to 1800° C. The calcination atmosphere for high melting point metals such as W and Mo, which are oxidized by calcination in an oxidizable atmosphere, and Cu etc., includes a nitrogen atmosphere, a nitrogen atmosphere containing steam, a nitrogen atmosphere containing hydrogen and steam, a reducing atmosphere containing hydrogen, or an inactive atmosphere, and for precious metal conductors of Au, Ag, Pd or Pt, appropriate oxidizable atmospheres such as the atmosphere are employed.

As described above, since only a small amount of an organic binder and of an organic solvent need be added to the organometallic compound in the present invention, the amount of organic substances can be remarkably reduced compared with the conventional pastes. Therefore, the volume loss of paste is insignificant and the above problems of the conventional methods are solved, and thus dense vias free from gaps can be formed. Furthermore, the organometallic compound is converted into a metallic oxide or metallic nitride after calcination, resulting in an increase of the adhesion strength, as described above.

When an organosilicic compound (e.g. polysilazane) is employed as the organometallic compound, the silicon compound and metallic powder are mixed, and if necessary, an amount of an organic binder and a solution are added to the obtained mixture. Polysilazane exhibits a function of an organic binder before the calcination of a substrate or the like, and is converted into amorphous $Si_3N_4$ after the calcination.

As described above, when used an organosilicic compound functions as an organic binder, the amount of organic substances can be noticeably reduced compared with the usual pastes. Therefore, the volume loss of the paste is insiginificant and the problems of the conventional methods are solved, and thus dense vias free from gaps can be formed.

BEST MODE OF CARRYING OUT THE INVENTION

The present invention is now explained in more detail with reference to working examples.

EXAMPLE 1

First, 20 g of aluminium-tri-sec-butoxide (sec-$C_4H_9O)_3Al$ (liquid), 100 g of methyl ethyl ketone, 0.1 g of ethyl cellulose, and 5 g of turpentine oil were mixed together, 100 g of tungsten powder with a particle diameter of 1.0 μm were added to the thus-obtained mixture, and the obtained mixture was kneaded by a kneader, and methyl ethyl ketone was volatilized, whereby a tungsten paste was prepared.

The thus-prepared tungsten paste was filled into holes with a diameter of 100 μm provided in a green sheet (containing 100 parts of AlN, 2 parts of $CaCO_3$, PMMA binder and dibutyl phthalate) with a thickness of 300 μm and covered with a carrier film, through the film (FIG. 2). Ten of these green sheets were laminated (50° C., 30 MPa), and after the binder was removed from the thus-prepared laminate in a nitrogen atmosphere at a temperature of 900° C., the laminate was calcinated in a nitrogen flow under 1 atm at a temperature of 1800° C. for 8 hours.

Aluminium-tri-sec-butoxide (sec-$C_4H_9O)_3Al$ (MW=246.32) is a colorless liquid at normal temperature, and has a density(d) of 0.967. As described above, methyl ethyl ketone (MEK), a low boiling solvent, is volatilized while the paste is being prepared, and thus the percentage composition (wt %) and volume ratio (vol %) of the prepared tungsten (W) paste are as set forth in the following Table 1.

TABLE 1

| Component | Composition (g) | Percentage composition (wt %) | Volume (cm³) | Volume ratio (vol %) |
|---|---|---|---|---|
| W powder | 100 | 79.93 | 5.181 | 16.54 |
| (sec—$C_4H_9O)_3Al$ | 20 | 15.99 | 20.682 | 66.04 |
| terpineol | 5 | | 5.354 | 17.10 |
| ethyl cellulose | 0.1 | 4.08 | 0.1 | 0.32 |
| Total | 125.1 | 100 | 31.318 | 100 |

Note:
The density (d) of W ≈ 19.3 the density (d) of turpentine ≈ 0.9338 the density (d) of ethyl cellulose ≈ 1.

It is evident from the above volume ratio that (sec-$C_4H_9O)_3Al$, an organometallic compound, is the major constituent of the present W paste. In the process of removing, in a nitrogen atmosphere, the binder contained in the laminate of AlN green sheets and in the holes in which the W paste is filled, and conducting the main calcination, aluminium-tri-sec-butoxide (sec-$C_4H_9O)_3Al$ contained in the W paste is heat-decomposed to thereby produce AlN or $Al_2O_3$, an inorganic substance, according to the following reaction formula (1) or (2).

$$(C_4H_9O)_3Al \xrightarrow{\text{calcination in } N_2} AlN \quad (1)$$
$$(MW\ 246.325) \qquad (MW\ 40.988)$$

$$(C_4H_9O)_3Al \xrightarrow{\text{calcination in } N_2} \tfrac{1}{2} Al_2O_3 \quad (2)$$
$$(MW\ 101.961)$$

It is calculated from the above formulas that 20 g of aluminium-tri-sec-butoxide (sec-$C_4H_9O)_3Al$ under calcination produces respectively 3.328 g of AlN calculated in AlN equivalent according to the formula (1) and 4.139 g of $Al_2O_3$ calculated in $Al_2O_3$ equivalent according to the formula (2). In more detail, tungsten conductors with the percentage compositions as set forth in the following Table 2 and Table 3 are formed in the holes for vias. By any reaction of the formulas (1) and (2), a tungsten conductor containing from about 3 to about 4 wt % (corresponding to about 16 to 17 vol % calculated from the density thereof) of an inorganic substance is prepared.

TABLE 2

| Corres. to the formula (1) | | Weight ratio | | Volume ratio | |
|---|---|---|---|---|---|
| | | Weight | wt % | Volume | Vol % |
| Conductor | W | 100 g | 96.78 | 5.1813 cm³ | 82.60 |
| Inorganic substance | AlN | 3.328 g | 3.22 | 1.0911 cm³ | 17.40 |
| | | 103.328 g | 100 | 6.272 cm³ | 100 |

TABLE 3

| Corres. to the formula (2) | | Weight ratio | | Volume ratio | |
|---|---|---|---|---|---|
| | | Weight | wt % | Volume | Vol % |
| Conductor | W | 100 g | 96.03 | 5.1813 cm³ | 83.61 |
| Inorganic | Al₂O₃ | 4.139 g | 3.97 | 1.015 cm³ | 16.39 |
| substance | | 104.139 g | 100 | 6.197 cm³ | 100 |

Note: d of Al₂O₃ ≈ 4.075, d of AlN ≈ 3.05

EXAMPLE 2

The tungsten paste prepared in Example 1 was employed. The tungsten paste was filled, using a squeezer, directly into holes with a diameter of 100 μm provided in an AlN substrate. The substrate was calcined in a nitrogen atmosphere at a temperature of 1700° C. for 60 min.

The comparison between the results of the above two examples and those of the conventional methods (the methods in which a paste containing no organometallic compound corresponding to the second component of the present composition is employed; the same hereinafter) are set forth in Table 4. The filled states of vias are illustrated in FIGS. 3(a)–3(d).

TABLE 4

Comparison between Examples 1 & 2 and conventional methods

| | | Filling factor of via (%) | Presence of gap | Adhesion degree | Figure |
|---|---|---|---|---|---|
| Conventional methods | filling of paste | 55 | Yes | Δ | 3 (a) |
| | filling of powder | 70 | Yes | Δ | 3 (b) |
| Present method | Example 1 | 97 | No | ○ | 3 (c) |
| | Example 2 | 92 | No | ○ | 3 (d) |

EXAMPLE 3

First, 20 g of aluminium-tri-sec-butoxide (sec-$C_4H_9O)_3Al$ (liquid), 100 g of methyl ethyl ketone, 0.1 g of ethyl cellulose, and 5 g of terpeneol were mixed together, 100 g of copper powder with a particle diameter of 0.5 μm added to the thus-obtained mixture, the obtained mixture was kneaded by a kneader, and methyl ethyl ketone was volatilized, whereby a copper paste was prepared.

The thus-prepared copper paste was filled into holes with a diameter of 100 μm in a glass ceramic green sheet (containing 50 wt % of glass, 50 wt % of alumina, PMMA binder and dibutyl phthalate) with a thickness of 300 μm and covered with a carrier film, the filling being effected through said film (FIG. 2). Ten of these green sheets were laminated (130° C., 30 MPa), and after the thus-obtained laminate had been purged of binder in a nitrogen atmosphere at a temperature of 850° C., it was calcinated at a temperature of 1000° C. The percentage composition (wt %) and volume ratio (vol %) of the copper (Cu) paste prepared after the above low boiling solvent, methyl ethyl ketone, was volatilized, are as set forth in Table 5.

TABLE 5

| Component | Composition (g) | Percentage composition (wt %) | Volume (cm³) | Volume ratio (vol %) |
|---|---|---|---|---|
| Cu powder | 100 | 79.93 | 11.194 | 29.99 |
| (sec—$C_4H_9O)_3Al$ | 20 | 15.99 | 20.682 | 55.40 |
| terpineol | 5 | | 5.354 | 14.34 |

TABLE 5-continued

| Component | Composition (g) | Percentage composition (wt %) | Volume (cm³) | Volume ratio (vol %) |
|---|---|---|---|---|
| ethyl cellulose | 0.1 | 4.08 | 0.1 | 0.27 |
| Total | 125.1 | 100 | 37.331 | 100 |

Note: the density (d) of Cu ≈ 8.933

It is evident from the above volume ratio that (sec-$C_4H_9O)_3Al$, an organometallic compound, is the major constituent of the present copper paste. In the process of removing, in a nitrogen atmosphere, the binder contained in the laminate of glass ceramic green sheets and in the holes of which the copper paste is filled, and of conducting the main calcination, aluminium-tri-sec-butoxide (sec-$C_4H_9O)_3Al$ contained in the copper paste is heat-decomposed to thereby produce AlN or Al₂O₃, an inorganic substance, according to the above reaction formula (1) or (2). It is calculated from the above formulas that 20 g of aluminium-tri-sec-butoxide (sec-$C_4H_9O)_3Al$ under calcination produces, respectively, 3.328 g of AlN calculated in AlN equivalent according to the formula (1) and 4.139 g of Al₂O₃ calculated in Al₂O₃ equivalent according to the formula (2). In more detail, copper conductors with the percentage compositions (wt %) as set forth in the following Table 6 and Table 7 are formed out of the above copper paste in the holes for vias. Due to the reaction of the formulas (1) and (2), a copper conductor containing from about 3 to about 4 wt % (corresponding to about 8 vol % calculated from the density thereof) of an inorganic substance is prepared.

TABLE 6

| Corres. to the formula (1) | | Weight ratio | | Volume ratio | |
|---|---|---|---|---|---|
| | | Weight | wt % | Volume | Vol % |
| Conductor | Cu | 100 g | 96.78 | 11.194 cm³ | 91.12 |
| Inorganic | AlN | 3.328 g | 3.22 | 1.0911 cm³ | 8.88 |
| substance | | 103.328 g | 100 | 12.285 cm³ | 100 |

TABLE 7

| Corres. to the formula (2) | | Weight ratio | | Volume ratio | |
|---|---|---|---|---|---|
| | | Weight | wt % | Volume | Vol % |
| Conductor | Cu | 100 g | 96.03 | 11.194 cm³ | 91.68 |
| Inorganic | Al₂O₃ | 4.139 g | 3.97 | 1.015 cm³ | 8.32 |
| substance | | 104.139 g | 100 | 12.210 cm³ | 100 |

EXAMPLE 4

The copper paste prepared in Example 3 was employed. This copper paste was filled, using a squeezer, directly into the holes with a diameter of 100 μm in an alumina substrate (FGA substrate). The substrate was calcined for 10 min in a nitrogen atmosphere at a temperature of 1000° C.

The comparison between the results of Examples 3 & 4 and those of the conventional methods is set forth in Table 8. The filled states of the vias are illustrated in FIGS. 3(a)–3(h).

TABLE 8

Comparison between Examples 3 & 4 and conventional methods

|  |  | Filling factor of via (%) | Presence of gap | Adhesion degree | Figure |
|---|---|---|---|---|---|
| Conventional methods | filling of paste | 55 | Yes | Δ | 3 (e) |
|  | filling of powder | 70 | Yes | Δ | 3 (f) |
| Present method | Example 3 | 95 | No | ○ | 3 (g) |
|  | Example 4 | 90 | No | ○ | 3 (h) |

EXAMPLE 5

First, 20 g of dicyclopentadienylzirconium dichloride $(C_5H_5)_2ZrCl_2$ (white crystal), 100 g of methyl ethyl ketone, 0.1 g of ethyl cellulose, 5 g of terpeneol were mixed, together, 100 g of copper powder with a particle diameter of 0.5 μm were added to the thus-obtained mixture, and the obtained mixture was kneaded by a kneader, and methyl ethyl ketone was volatilized, whereby a copper paste was prepared.

The thus-prepared copper paste was filled, using a squeezer, directly into the holes with a diameter of 100 μm in a $ZrO_2$ substrate (FIGS. 1(a) and 1(b)), and after the substrate was dried, it was calcined in a nitrogen atmosphere at a temperature of 1000° C.

Figure 3A:
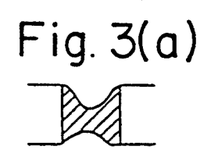
FIGS. 3(a) to 3(f) are explanatory views illustrating the filling states of via holes.
Figure 3B:
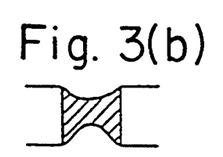
Figure 3C:
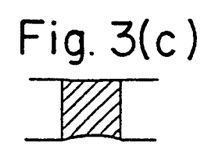
Figure 3D:
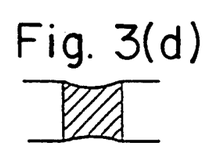
Figure 3E:
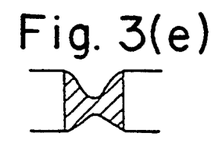
Figure 3F:
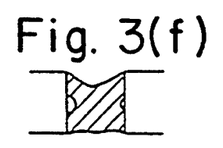
Figure 3G:
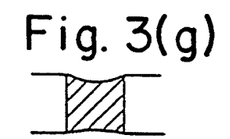
Figure 3H:
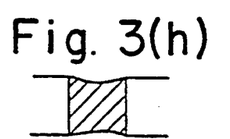
Figure 3I:
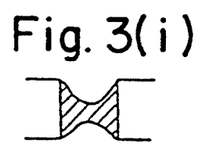
Figure 3J:
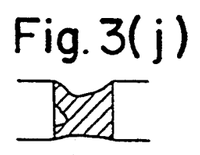
Figure 3K:
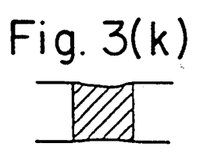

The comparison between the results of the present example and those of the conventional methods is set forth in Table 9. The filled states of the vias are illustrated in FIGS. 3(i)–3(k).

TABLE 9

Comparison between Example 9 and conventional methods

|  |  | Filling factor of via (%) | Presence of gap | Degree of Adhesion | Figure |
|---|---|---|---|---|---|
| Conventional methods | paste filling | 55 | Yes | Δ | 3 (i) |
|  | powder filling | 70 | Yes | Δ | 3 (j) |
| Present method | Example 5 | 95 | No | ○ | 3 (k) |

Dicyclopentadienylzirconium dichloride $(C_5H_5)_2ZrCl_2$ (MW=292.317) is a white solid crystal (at normal temperature) with a melting point of from 247° to 249° C. As described above, since methyl ethyl ketone, a low boiling point solvent, is volatilized when the paste is being prepared, terpeneol is the only liquid component of the prepared copper (Cu) paste, and thus a nearly powdered Cu paste composition is prepared. In the process of calcining, in a nitrogen atmosphere, the $ZrO_2$ substrate, in the holes for vias of which the Cu paste is filled, $(C_5H_5)_2ZrCl_2$ contained in the Cu paste is heat decomposed, so that ZrN or $ZrO_2$, an inorganic substance, is produced, the latter being produced by the reaction of $(C_5H_5)_2ZrCl_2$ and $H_2O$ contained in the nitrogen atmosphere.

It is calculated from the above reaction formulas that 20 g of dicyclopentadienylzirconium dichloride $(C_5H_5)_2ZrCl_2$ under calcination produces 7.199 g of ZrN calculated in ZrN equivalent according to formula (3) and 8.430 g of $ZrO_2$ calculated in $ZrO_2$ equivalent according to formula (4), and from the above copper paste, a copper conductor with the percentage composition as set forth in the following Table 10 is formed in the through-holes of a via. The reactions of formulas (3) and (4) form a copper conductor containing about 7 wt % of an inorganic substance.

TABLE 10

|  | Corres. to formula (3) | | | Corres. to formual (4) | | |
|---|---|---|---|---|---|---|
|  | component | composition (g) | wt % | component | composition (g) | wt % |
| Conductor | Cu | 100 | 93.28 | Cu | 100 | 92.23 |
| Inorganic substance | ZrN | 7.199 | 6.72 | $ZrO_2$ | 8.430 | 7.77 |
|  |  | 100 |  |  | 100 |  |

EXAMPLE 6

First, 20 g of n-butylmagnesium chloride n-$C_4H_9MgCl$ (liquid), 100 g of methyl ethyl ketone, 0.1 g of ethyl cellulose, and 5 g of terpeneol were mixed together, 100 g of copper powder with a particle diameter of 0.5 μm were added to the obtained mixture, the obtained mixture was kneaded by a kneader, and methyl ethyl ketone was volatilized, whereby a copper paste was prepared.

The thus prepared copper paste was filled, using a squeezer, directly into the holes with a diameter of 100 μm provided on a MgO substrate (FIG. 1), and after the substrate was dried, it was calcined in a nitrogen atmosphere at a temperature of 1000° C.

Figure 3L:
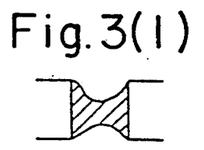
Figure 3M:
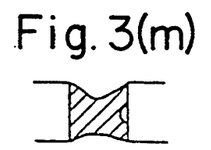
Figure 3N:
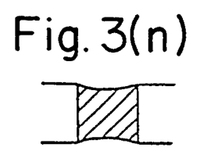
Figure 3O:
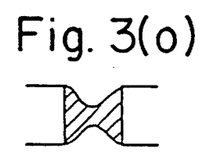
Figure 3P:
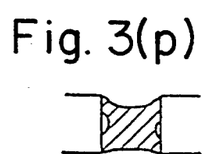
Figure 3Q:
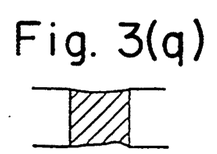
Figure 3R:
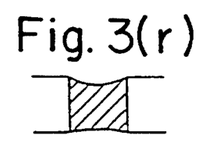
Figure 3S:
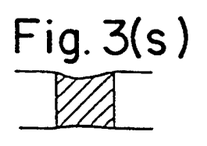
Figure 3T:
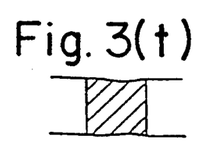

The comparison between the results of the present example and the results of the conventional methods is summarized in Table 11. The filled states of the vias are illustrated in FIGS. 3(l)–3(n).

TABLE 11

Comparison between Example 6 and conventional methods

|  |  | Filling factor of via (%) | Presence of gap | Degree of Adhesion | Figure |
|---|---|---|---|---|---|
| Conventional methods | filling of paste | 55 | Yes | Δ | 3 (l) |
|  | filling of powder | 70 | Yes | Δ | 3 (m) |
| Present invention | Example 6 | 95 | No | ○ | 3 (n) | n-butylmagnesium chloride n-$C_4H_9MgCl$ MW=116.873 is a brown liquid with a density (d) of 0.93. The components, composition etc. of the above copper paste are as set forth in Table 12.

TABLE 12

| Component | Composition (g) | Percentage composition (wt %) | Volume (cm³) | Volume ratio (vol %) |
|---|---|---|---|---|
| Cu powder | 100 | 79.93 | 11.194 | 29.34 |
| n-C$_4$H$_9$MgCl | 20 | 15.99 | 21.505 | 56.37 |
| terpeneol | 5 | 4.08 | 5.354 | 14.03 |
| ethyl cellulose | 0.1 | | 0.1 | 0.26 |
| Total | 125.1 | 100 | 38.153 | 100 |

As easily seen from the volume ratio in the above Table, n-C$_4$H$_4$MgCl is the major constituent of the present copper paste.

When the MgO substrate filled with the copper paste is calcined in a N$_2$ atmosphere, n-C$_4$H$_4$MgCl is reacted with H$_2$O, CO$_2$, CO, etc. to produce MgO. Then 20 g of n-C$_4$H$_9$MgCl produces 6.897 g of MgO, and a copper conductor as set forth in Table 13 is formed in the holes for vias.

TABLE 13

| Component | Weight (g) | Percentage composition (wt %) | Volume (cm³) | Volume ratio (vol %) |
|---|---|---|---|---|
| Cu powder | 100 | 93.55 | 11.194 | 85.46 |
| MgO | 6.897 | 6.45 | 1.905 | 14.54 |
| | | 100 | | 100 | d of MgO ≈ 3.65

EXAMPLE 7

First, 20 of nonamethyltrisilazane [(CH$_5$)$_3$Si]$_3$N (white crystal), 100 g of copper powder with a particle diameter of 0.5 μm, and 100 g of methyl ethyl ketone were mixed together, and the thus obtained mixture was kneaded by a kneader while methyl ethyl ketone was volatilized, whereby a copper powder composition was prepared.

Into the holes with a diameter of 100 μm provided on a glass ceramic green sheet (containing 50 wt % of glass, 50 wt % of alumina, PMMA binder and dibutyl phthalate) with a thickness of 300 μm covered with a carrier sheet, the thus prepared copper powder was filled through said film (FIG. 2). Ten sheets of such green sheets were laminated (130° C., 30 MPa), and after the thus prepared laminate having been purged of binder in a nitrogen atmosphere at a temperature of 850° C., the laminate was calcinated at a temperature of 1000° C.

Nonamethyltrisilazane [(CH$_3$)$_3$Si]$_3$N (MW=233.577) has a melting point of from 70° to 71° C., and is in the form of white crystal at normal temperature. As described above, MEK, a low boiling solvent, is volatilized during the kneading, and the percentage composition of the prepared copper powder composition is as set forth in Table 14.

TABLE 14

| Component | Weight (g) | Percentage composition (wt %) | Volume (cm³) | Volume ratio (vol %) |
|---|---|---|---|---|
| Cu powder | 100 | 83.33 | 11.194 | 36 |
| [(CH$_3$)$_3$Si]$_3$N | 20 | 16.67 | (20) | 64 |
| | | 100 | (31.194) | 100 |

Note: The density (d) of [(CH$_3$)$_3$Si]$_3$N is supposed to be 1.

When the glass ceramic green sheet, into the through-holes of which the above copper powder is filled, is purged of binder in a nitrogen atmosphere and then calcinated, nonamethyltrisilazene [(CH$_3$)$_3$Si]$_3$N contained in the copper powder is heat decomposed according to the following reaction formula (5), to thereby produce Si$_3$N$_4$, an inorganic substance.

$$[(CH_3)_3Si]_3N \xrightarrow{\text{calcination in } N_2} Si_3N_4 \quad (5)$$
$$\text{MW 233.577} \qquad \qquad \text{MW 140.285}$$

Thus, 20 g of [(CH$_3$)$_3$Si]$_3$N, produces 12.01 g of Si$_3$N$_4$ calculated in Si$_3$N$_4$ equivalent, and therefore, a copper conductor containing about 10 wt % (corresponding to about 24 vol %) of an inorganic substance as set forth in Table 15 is formed in the holes for vias of the substrate.

TABLE 15

| | Weight (g) | Percentage composition (wt %) | Volume (cm³) | Volume ratio (vol %) |
|---|---|---|---|---|
| Cu | 100 | 89.3 | 11.194 | 76.2 |
| Si$_3$N$_4$ | 12.012 | 10.7 | 3.492 | 23.8 |
| | 112.012 | 100 | 14.686 | 100 |

Note: The density (d) of Si$_3$N$_4$ 3.444

EXAMPLE 8

The copper powder prepared in Example 7 was employed. This copper powder was filled, using a squeezer, directly into an alumina substrate (FGA substrate) in which holes with a diameter of 100 μm are bored. This substrate was calcined in a nitrogen atmosphere at a temperature of 1000° C. for 10 min.

EXAMPLE 9

First, 20 g of nonamethyltrisilazane [(CH$_3$)$_3$Si]$_3$N (white crystal), 100 g of copper powder with a particle diameter of 0.5 μm, 100 g of methyl ethyl ketone, 0.1 g of ethyl cellulose and 5 g of terpeneol were mixed together, and the thus obtained mixture was kneaded by a kneader while methyl ethyl ketone was volatilized, whereby a copper paste was prepared.

Into the holes with a diameter of 100 μm in a glass ceramic green sheet (containing 50 wt % of glass, 50 wt % of alumina, PMMA binder and dibutyl phthalate) with a thickness of 300 μm covered with a carrier sheet, the thus prepared copper paste was filled through said film (FIG. 2). Ten sheets of such green sheets were laminated (130° C., 30 MPa), and after the thus prepared laminate had been purged of binder in a nitrogen atmosphere at a temperature of 850° C., the laminae was calcinated at a temperature of 1000° C.

EXAMPLE 10

First, 20 g of nonamethyltrisilazane [(CH$_3$)$_3$Si]$_3$N (white crystal), 100 g of tungsten powder with a particle diameter of 1.0 μm, and 100 g of methyl ethyl ketone were mixed together, and the thus obtained mixture was kneaded by a kneader while methyl ethyl ketone was volatilized, whereby a tungsten (W) powder was prepared.

Into the holes with a diameter of 100 μm in an AlN green sheet (100 parts of AlN, 2 parts of CaCO$_3$, binder and dibutyl phthalate) with a thickness of 300 μm covered with a carrier sheet, the thus prepared W powder was filled through said film. Ten of such green sheets were laminated (50° C., 30 MPa), and after thus prepared laminate was purged of binder in a nitrogen atmosphere at a temperature of 900° C., it was calcinated in a nitrogen atmosphere under 1 atm and at a temperature of 1800° C. for 8 hours.

The comparison between the results of Examples 7 to 10 and those of the conventional methods are set forth in Table 16. The filled states of the vias are illustrated in FIGS. 3(o)-3(t).

TABLE 16

|  |  | Filling factor of via (%) | Presence of gap | Sign in FIG. 3 |
| --- | --- | --- | --- | --- |
| Conventional methods | filling of paste | 55 | Yes | 3 (o) |
|  | filling of powder | 70 | Yes | 3 (p) |
| Present method | Example 7 | 95 | No | 3 (q) |
|  | Example 8 | 90 | No | 3 (r) |
|  | Example 9 | 92 | No | 3 (s) |
|  | Example 10 | 95 | No | 3 (t) |

As described above, nonamethyltrisilazane $[(CH_3)_3Si]_3N$ is in the form of white crystals at normal temperature, and MEK, a low boiling point solvent, is volatilized when kneaded, so that a powdered composition is obtained. In addition, by the process of removing binder from the laminate of AlN green sheets into the through-holes of which the W powder composition is filled and of subjecting said laminate to a main calcination, $[(CH_3)_3Si]_3N$ contained in the W powder composition is heat decomposed in a nitrogen atmosphere and $Si_3N_4$, an inorganic substance, is produced as shown in the above reaction formula (5). As 12.012 g of $Si_3N_4$ is produced as calculated in $Si_3N_4$ equivalent from 20 g of $[(CH_3)_3Si]_3N$, a tungsten conductor consisting of 89.3 wt % of W and 10.7 wt % of $Si_3N_4$ (59.7 vol % of W and 40.3 vol % of $Si_2N_4$ respectively as a volume ratio; the density d of $Si_3N_4 = 3.44$) is formed in the holes for vias.

INDUSTRIAL UTILIZATION OF THE INVENTION

As explained above, as the present composition for the formation of vias is composed of a certain kind of metallic powder and 5 to 40 wt %, based on the weight of said metallic powder, of an organometallic compound or in addition thereto, a heat decomposable organic binder and a high boiling point organic solvent, the present composition has little volume loss after calcination when filled into the holes of a substrate, and thus, with the present composition, it becomes possible to form dense vias free from gaps.

In addition, the adhesion strength between a substrate and a conductor can be improved by using the present composition because, after the calcination of the substrate, the coefficient of the substrate is approximately that of the conductor or because an organometallic compound of the present composition is converted into a metallic oxide or a metallic nitride.

We claim:
1. A composition for use in forming ceramic via, comprising:
   (a) at least one powder containing copper, gold, silver, tungsten, molybdenum, nickel, palladium, platinum, aluminium, or an alloy thereof; and
   (b) 5 to 40 wt %, based on the weight of the powder in the composition, of one or more of an organosilicic compound, an organoaluminium compound, an organozirconium compound and an organomagnesium compound.

2. A composition for use in forming ceramic via, comprising:
   (a) at least one powder containing copper, gold, silver, tungsten, molybdenum, nickel, palladium, platinum, aluminium, or an alloy thereof;
   (b) 5 to 40 wt %, based on the weight of the powder in the composition, of one or more of an organosilicic compound, an organoaluminium compound, an organozirconium compound and an organomagnesium compound;
   (c) 0.5 to 5 wt %, based on the weight of the powder in the composition, of a binder material comprising a cellulose derivative or a heat decomposable polymethamethyl acrylate; and
   (d) 1 to 20 wt %, based on the weight of the composition, of an organic solvent having a boiling point between about 180° C. and 400° C.

3. A method of forming ceramic vias, comprising:
   providing a substrate, having holes bored therein, selected from the group comprising a glass ceramic composite substrate, an alumina substrate, a magnesia substrate, a zirconia substrate, an aluminum nitride substrate, and green sheets thereof;
   forming a composition comprising:
   (a) at least one powder containing copper, gold, silver, tungsten, molybdenum, nickel, palladium, platinum, aluminium, or an alloy thereof, and
   (b) 5 to 40 wt %, based on the weight of the powder in the composition, of one or more of an organosilicic compound, an organoaluminium compound, an organozirconium compound and an organomagnesium compound;
   filling the composition into the holes of the substrate; and
   calcinating the substrate.

4. A method of forming ceramic vias, comprising:
   providing a substrate, having holes bored therein, selected from the group comprising a glass ceramic composite substrate, an alumina substrate, a magnesia substrate, zirconia substrate, an aluminum nitride substrate, and green sheets thereof;
   forming a composition comprising:
   (a) at least one powder containing copper, gold, silver, tungsten, molybdenum, nickel, palladium, platinum, aluminium, or an alloy thereof,
   (b) 5 to 40 wt %, based on the weight of the powder in the composition, of one or more of an organosilicic compound, an organoaluminium compound, an organozirconium compound and an organomagnesium compound,
   (c) 0.5 to 5 wt %, based on the weight of the powder in the composition, of a binder material comprising a cellulose derivative or a heat decomposable polymethamethyl acrylate; and
   (d) 1 to 20 wt %, based on the weight of the composition, of an organic solvent having a boiling point between about 180° C. to 400° C.;
   filling the composition into the holes; and
   calcinating the substrate.

5. A composition as in claim 1, wherein the composition is a powder composition.

6. A composition as in claim 2, wherein the composition is a paste composition.

7. A composition as in claim 2, wherein the organic solvent is a liquid component of the composition.

* * * * *

UNITED STATES PATENT AND TRADEMARK OFFICE
CERTIFICATE OF CORRECTION

PATENT NO. : 5,443,786
DATED : August 22, 1995
INVENTOR(S) : Hiromitsu YOKOYAMA et al.

It is certified that error appears in the above-indentified patent and that said Letters Patent is hereby corrected as shown below:

Title Page, [56], Foreign Pat. Documents, first entry insert --European Pat. Off.--.

Column 3, lines 27, 28, 29, 61, delete triple spacing.

Column 6, lines 3, 32, delete triple spacing.

Column 7, line 53, delete "(FIG.2)" and insert --(See FIGS. 2(a), 2(b) and 2(c))--.

Column 8, line 68, change "3(a)" to --3(e)--.

Column 9, line 56, before "dichloride" delete spacing.

Column 10, lines 12 and 65, delete triple spacing;

line 16, change "ZrO2calculated" to --ZrO2 calculated--;

last line, move "100" (both occurrences) to the right one column.

UNITED STATES PATENT AND TRADEMARK OFFICE
CERTIFICATE OF CORRECTION

PATENT NO. : 5,443,786
DATED : August 22, 1995
INVENTOR(S) : Hiromitsu YOKOYAMA et al.

It is certified that error appears in the above-indentified patent and that said Letters Patent is hereby corrected as shown below:

Column 12, line 24, after "$Si_3N_4$" insert --≒--

Column 13, Table 16, change "Sign in FIG. 3" to --Figure--; and line 20, delete triple spacing.

Column 14, line 42, after "," (first occurrence) insert --a--.

Signed and Sealed this

Ninth Day of April, 1996

Attest:

BRUCE LEHMAN

*Attesting Officer*　　　*Commissioner of Patents and Trademarks*